(12) United States Patent
Czornomaz et al.

(10) Patent No.: US 9,786,664 B2
(45) Date of Patent: Oct. 10, 2017

(54) FABRICATING A DUAL GATE STACK OF A CMOS STRUCTURE

(71) Applicant: International Business Machines Corporation, Armonk, NY (US)

(72) Inventors: Lukas Czornomaz, Rueschlikon (CH); Veeresh Vidyadhar Deshpande, Rueschlikon (CH); Vladimir Djara, Rueschlikon (CH); Jean Fompeyrine, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/040,303

(22) Filed: Feb. 10, 2016

(65) Prior Publication Data
US 2017/0229460 A1   Aug. 10, 2017

(51) Int. Cl.
*H01L 21/8239* (2006.01)
*H01L 27/092* (2006.01)
*H01L 29/201* (2006.01)
*H01L 29/161* (2006.01)
*H01L 21/8238* (2006.01)
*H01L 21/02* (2006.01)
*H01L 29/66* (2006.01)

(52) U.S. Cl.
CPC ...... *H01L 27/0922* (2013.01); *H01L 21/0206* (2013.01); *H01L 21/823807* (2013.01); *H01L 21/823842* (2013.01); *H01L 29/161* (2013.01); *H01L 29/201* (2013.01); *H01L 29/66545* (2013.01)

(58) Field of Classification Search
CPC ........... H01L 21/823828–21/82385; H01L 2007/11866; H01L 21/823857; H01L 21/823821
See application file for complete search history.

(56) References Cited

U.S. PATENT DOCUMENTS

| | | | | |
|---|---|---|---|---|
| 2006/0270239 | A1* | 11/2006 | Triyoso | H01L 21/265 438/706 |
| 2010/0213553 | A1* | 8/2010 | Hargrove | H01L 21/28167 257/410 |
| 2010/0295022 | A1* | 11/2010 | Chang | B82Y 10/00 257/24 |

* cited by examiner

*Primary Examiner* — Mary Wilczewski
*Assistant Examiner* — Tsz Chiu
(74) *Attorney, Agent, or Firm* — Harrington & Smith

(57) ABSTRACT

A dual gate CMOS structure including a semiconductor substrate; a first channel structure including a first semiconductor material and a second channel structure including a second semiconductor material on the substrate. The first semiconductor material including $Si_xGe_{1-x}$ where x=0 to 1 and the second semiconductor material including a group III-V compound material. A first gate stack on the first channel structure includes: a first native oxide layer as an interface control layer, the first native oxide layer comprising an oxide of the first semiconductor material; a first high-k dielectric layer; a first metal gate layer. A second gate stack on the second channel structure includes a second high-k dielectric layer; a second metal gate layer. The interface between the second channel structure and the second high-k dielectric layer is free of any native oxides of the second semiconductor material.

16 Claims, 8 Drawing Sheets

FABRICATING A DUAL GATE STACK OF A CMOS STRUCTURE

BACKGROUND

The embodiments of the invention relate generally to the fabrication of semiconductor devices and more particularly to the fabrication of dual gate stacks of a CMOS structure having two different channel materials on a common semiconductor substrate.

Leading edge Si CMOS industry is facing strong limitations with Si for 10 nm node and beyond. One promising approach to achieving sub-10 nm geometry devices is co-integration of $Si_xGe_{1-x}$ (where x=0 to 1) p-FETs with group III-V compound n-FETs.

Scaling the gate stack and obtaining high-quality gate stacks are particular challenges.

High-k gate dielectrics are used to scale down the equivalent oxide thickness of the gate dielectric while controlling gate leakage. However, dual CMOS gate stacks on $Si_xGe_{1-x}$ and group III-V compound materials require different interface materials between the channel materials and the gate stack.

SUMMARY

According to a first aspect, the invention is embodied as a method for fabricating a dual gate stack of a CMOS structure. The method comprises steps of providing a semiconductor substrate and forming a first channel structure comprising a first semiconductor material and a second channel structure comprising a second semiconductor material on the substrate. The first semiconductor material is comprised of $Si_xGe_{1-x}$ where x=0 to 1 and the second semiconductor material is comprised of a group III-V compound material. Further steps provide oxidizing a surface of the first channel structure and a surface of the second channel structure, thereby forming a first native oxide layer comprising an oxide of the first semiconductor material and a second native oxide layer comprising an oxide of the second semiconductor material. The first native oxide layer and the second native oxide layer are treated by a selective cleaning process that selectively removes the second native oxide layer only. Then a first gate stack comprising the first native oxide layer as interface control layer, a first high-k dielectric layer and a first metal gate layer is formed on the first channel structure and a second gate stack comprising a second high-k dielectric layer and a second metal gate layer is formed on the second channel structure.

According to another aspect the invention is embodied as a dual gate CMOS structure comprising a semiconductor substrate, a first channel structure comprising a first semiconductor material and a second channel structure comprising a second semiconductor material on the substrate. The first semiconductor material is comprised of $Si_xGe_{1-x}$ where x=0 to 1 and the second semiconductor material is comprised of a group III-V compound material. The structure further comprises a first gate stack on the first channel structure and a second gate stack on the second channel structure. The first gate stack comprises a first native oxide layer as interface control layer, a first high-k dielectric layer and a first metal gate layer. The first native oxide layer comprises an oxide of the first semiconductor material. The structure further comprises a second gate stack on the second channel structure. The second gate stack comprises a second high-k dielectric layer and a second metal gate layer. The interface between the second channel structure and the second high-k dielectric layer is free of any native oxides of the second semiconductor material.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

FIG. 1 shows a cross sectional view of a starting structure comprising a substrate with a first channel structure comprising a first semiconductor material and a second channel structure comprising a second semiconductor material thereon;

FIG. 2 shows a cross-sectional view after a wet cleaning step that has removed natively grown oxide layers from the surfaces of the first and the second channel structure;

FIG. 3 shows a cross-sectional view after a step of chemically oxidizing the surfaces of the first channel structure and the second channel structure to grow first and second native oxide layers respectively;

FIG. 4 shows a cross-sectional view after removal of the second native oxide layer by selective cleaning;

FIG. 5 shows a cross-sectional view after deposition of layers of a first gate stack and a second gate stack;

FIG. 6 shows a cross-sectional view after forming the first and the second gate stack;

FIG. 7 shows a cross-sectional view of a final device structure comprising a p-FET transistor and a n-FET transistor formed on a common semiconductor substrate;

FIG. 8 illustrates a cross-sectional view of a starting structure corresponding to the starting structure of FIG. 1;

FIG. 9 shows a cross-sectional view of the structure of FIG. 8 after the formation of a first unpatterned dummy gate stack structure and a second unpatterned dummy gate stack structure;

FIG. 10 shows a cross-sectional view of the structure of FIG. 9 after the first dummy gate stack structure and the second dummy gate stack structure have been patterned and etched;

FIG. 11 shows a cross-sectional view after formation of raised source and drain layers;

FIG. 12 shows a cross-sectional view after removal of the first dummy gate stack and the second dummy gate stack and forming a first cavity structure and a second cavity structure;

FIG. 13 shows a cross-sectional view after a first native oxide layer has been grown in the first cavity and a second native oxide layer has been grown in the second cavity;

FIG. 14 show a cross-sectional view of the structure of FIG. 13 after the surfaces of the first native oxide layer and the second native oxide layer have been treated with a selective cleaning process that has selectively removed the second native oxide layer only; and FIG. 15 shows a cross-sectional view of a final device structure after the formation of a first gate stack in the first cavity structure and the formation of a second gate stack in the second cavity structure.

DETAILED DESCRIPTION

In reference to FIGS. 1-15, some general aspects and terms of embodiments of the invention are described first.

According to embodiments of the invention, the term native oxide refers to an oxide that is grown from an underlying semiconductor material either in a controlled manner using an oxidizing agent or grown in an uncontrolled manner due to exposure to ambient conditions.

A semiconductor substrate may be a bulk semiconductor substrate, a substrate comprising an insulating layer such as a silicon on insulator (SOI) substrate or a hybrid substrate.

A high k-dielectric layer is a layer comprising a dielectric material having a higher dielectric constant k than Sift. Sift has a dielectric constant k of 3.9 and accordingly dielectric materials having a dielectric constant k of more than 3.9 are denoted as high-k materials.

FIGS. 1-7 show successive stages of a method for fabricating a dual gate CMOS structure according to an embodiment of the invention. FIGS. 1-7 and the other Figures subsequently described below generally show enlarged cross-sectional views of initial, intermediate and final structures formed during the stages of the method. In any or all of the figures the dimensions may not be drawn to scale and may be shown in a simplified and schematic way to illustrate the features and principles of embodiments of the invention.

FIGS. 1-7 show successive stages for fabricating a dual gate CMOS structure in which the gate stack is formed according to a "gate first" approach. In a "gate first" approach the gate stack is formed before the formation of the source layers and the drain layers.

Figure 1:
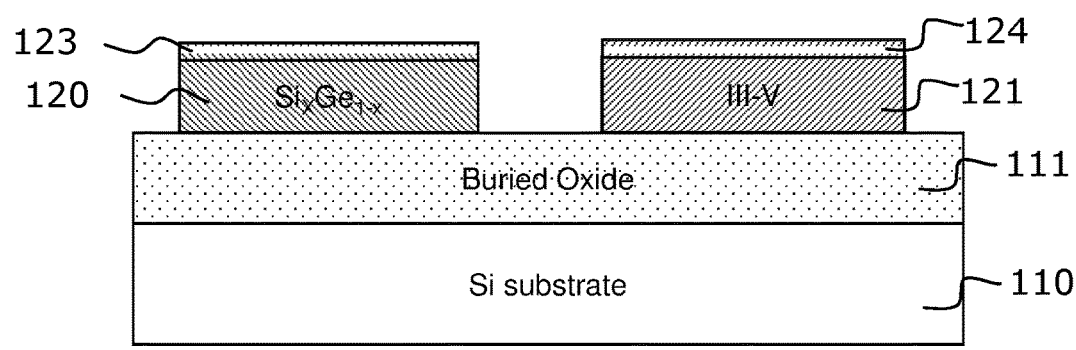
FIGS. 1-15 show cross sectional views of successive stages of a method for fabricating a CMOS structure according to embodiments of the invention.

FIG. 1 illustrates a cross-sectional view of a starting structure 100. The starting structure 100 comprises a substrate 110. The substrate 110 may be, e.g., embodied as a Si substrate or as a SiGe substrate. On the substrate 110 a first insulating layer 111 is provided. The insulating layer 111 may be embodied, e.g., as a dielectric layer comprising Sift and may be in the following also denoted as a buried oxide (BOX) layer. The thicknesses of the Si substrate 110 and the insulating layer 111 can be any suitable thicknesses. On the first insulating layer 111 a first channel structure 120 is formed on the left side that comprises a first semiconductor material. Furthermore, on the right side a second channel structure 121 is formed on the first insulating layer 111 that comprises a second semiconductor material. The first semiconductor material may be embodied as $Si_xGe_{1-x}$, where x=0 to 1. In other words, the first semiconductor material may be embodied as Silicon (Si), Germanium (Ge) or a SiGe alloy. In the following references to SiGe shall be understood as references to $Si_xGe_{1-x}$ where x=0 to 1. The first channel structure may be formed by any suitable methods known in the art, e.g., by Ge-condensation. The second channel structure may be formed by any suitable methods known in the art, such as selective epitaxy or wafer bonding.

The second semiconductor material may be generally embodied as a group III-V compound material. According to preferred embodiments the second semiconductor material may be $In_xGa_{1-x}As$ where x=0 to 1, i.e. from GaAs to InAs. According to another preferred embodiment the second semiconductor material may be InP or InGaSb. According to other embodiments further alloyed combinations of (In, Ga) and (As, Sb, P) may be used.

The first channel structure 120 and the second channel structure 121 may have a thickness of, for example, about 5 nm that corresponds to a desired channel thickness of a subsequently formed PFET and NFET respectively.

According to another embodiment the first and the second gate channel structure could be formed directly on a bulk substrate, e.g., a bulk Si-substrate. The substrate 110 may also be denoted as wafer 110.

SiGe is a preferred material for the implementation of a P-Channel Field Effect Transistor (PFET) in view of its high hole mobility. Group III-V materials are preferred materials for implementing an N-Channel Field Effect Transistor (NFET) as they exhibit a high electron mobility.

On the first channel structure 120 there is shown a naturally grown oxide layer 123 and on the second channel structure 121 there is a naturally grown oxide layer 124. The naturally grown oxide layers 123 and 124 may have been grown as the surfaces of the first channel structure 120 and the second channel structure 121 have been exposed to air and therewith oxygen. However, the nature, quality and thickness of the naturally grown oxide layer 123 and the naturally grown oxide layer 124 is not controlled and may vary in dependence on the environmental conditions.

Figure 2:
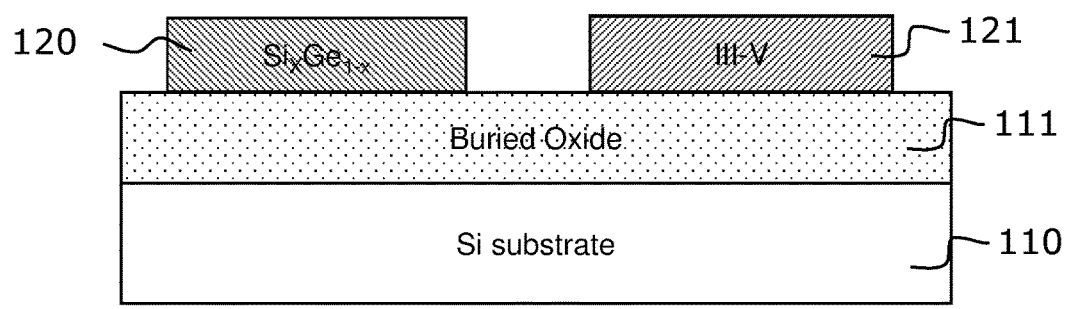

FIG. 2 shows a structure 200 that is a cross-sectional view of the structure of FIG. 1 after both the naturally grown oxide layer 123 and the naturally grown oxide layer 124 have been removed from the surfaces of the first channel structure 120 and the second channel structure 121. The removal could be done, e.g., by wet cleaning the surfaces with hydrofluoric acid (HF).

Figure 3:
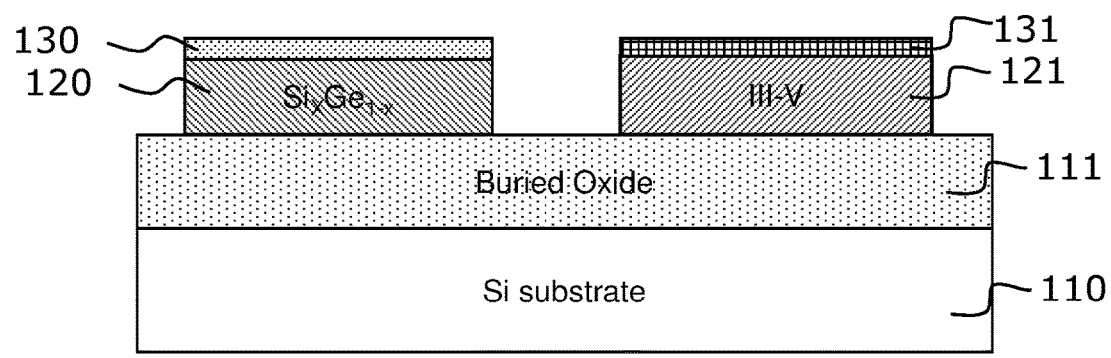

FIG. 3 shows a structure 300 that is a cross-sectional view of the structure of FIG. 2 after a first native oxide layer 130 and a second native oxide layer 131 have been grown on the surfaces of the first channel structure 120 and the second channel structure 121. The first native oxide layer 130 and the second native oxide layer 131 may be grown in particular by performing a controlled oxidation of the surfaces of the first channel structure 120 and the second channel structure 121. Such a controlled oxidation may be in particular a chemical oxidation. Such a controlled oxidation is an intentional oxidation with a control of the process parameters of the oxidation. This allows the thickness and quality of the first and the second native oxide layer to be controlled. This is in contrast to the naturally grown oxide layers 123, 124 which are grown in an uncontrolled manner due to exposure to the ambient conditions.

The first native oxide layer 130 comprises native oxides of the first semiconductor material, i.e., native oxides of Si and/or Ge, namely $SiO_2$ and/or $GeO_2$. The second native oxide layer 131 comprises native oxides of the second semiconductor material, i.e., native oxides of group III-V materials. Accordingly the second native oxide layer 131 may comprise, e.g., $In_2O_3$, $Ga_2O_3$ and/or $As_2O_3$.

According to embodiments the controlled oxidation may be a controlled self-limiting oxidation. This may facilitate the formation of thin native oxide layers.

According to preferred embodiments the first native oxide layer 130 has a thickness of less than 2 nm. According to further preferred embodiments it can have a thickness as small as a monolayer of oxide molecules which may correspond to a thickness of app. 0.3 nm.

The chemical oxidation of the exposed surfaces of the first channel structure 120 and the second channel structure 121 may be performed according to some embodiments by treatment of the surfaces with liquid solutions, e.g., with hydrogen peroxide ($H_2O_2$) or ozonated deionized water ($DIO_3$). According to such embodiments a wafer comprising the structure of FIG. 2 may be dipped into the liquid solution. According to another embodiment the surfaces may be treated with $O_2$ plasma. According to yet another embodiment the surfaces may be treated with ozone. According to yet another embodiment the first and the second native oxide layer may be formed by a low temperature thermal oxidation with a temperature below 500° C. The maximum temperature range is determined by the III-V materials that may not be exposed to more than 500° C. to avoid degradation of the materials.

According to yet another embodiment high pressure oxidation may be used.

The first native oxide layer 130 is desired and has the function of an interlayer for a subsequent formation of a gate stack structure on the first channel structure 120. More particularly, SiGe oxides provide an excellent interface control layer for the subsequent deposition of a high-k material. However, the second native oxide layer 131 is undesired for a subsequent formation of a gate stack on the second channel structure 121. More particularly, the interface of III-V materials and in particular the interface of InGaAs materials should preferably be free of any native oxide before the deposition of the high-k material.

In FIG. 3, the first native oxide layer 130 and the second native oxide layer 131 are unpatterned and cover the whole exposed surfaces of the first channel structure 120 and the second channel structure 121 respectively.

Figure 4:
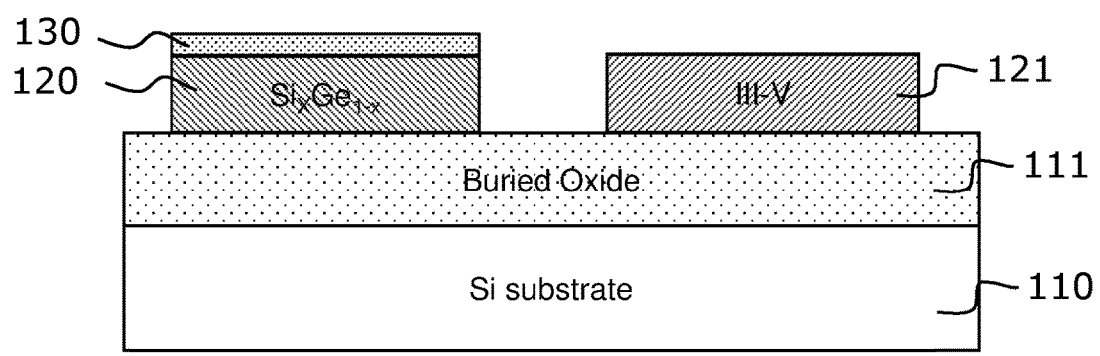

FIG. 4 show a structure 400 that is a cross-sectional view of the structure of FIG. 3 after the surfaces of the first native oxide layer 130 and the second native oxide layer 131 have been treated with a selective cleaning process. The selective cleaning process has selectively removed the second native oxide layer 131 only, while the first native oxide layer 130 has not been affected by the selective cleaning process and has remained unchanged or substantially unchanged. According to embodiments of the invention the selective cleaning process takes advantage of the different chemical behavior of the oxidized SiGe materials and the oxidized III-V materials.

According to one embodiment the selective cleaning process may be performed by wet cleaning. Suitable materials for such a selective wet cleaning are HCl, $H_3PO_4$ or $H_2SO_4$. Such a selective wet cleaning process is very cost efficient and easy to perform. As an example, the whole wafer could be dipped into a liquid solution comprising, e.g., HCl, $H_3PO_4$ or $H_2SO_4$. Due to the different chemical behavior of the native SiGe oxides and the native III-V oxides, only the III-V oxides will be affected by the selective cleaning while the SiGe oxides remain unaffected. Accordingly, only the second native oxide layer 131 comprising the III-V oxides will be removed from the surface of the second channel structure 121 during the selective cleaning process, while the first native oxide layer 130 comprising the SiGe oxides will remain on the surface of the first channel structure 120.

According to another preferred embodiment the selective cleaning process may be performed by dry cleaning. According to such an embodiment the first and the second native oxide layer may be treated, e.g., by $H_2$ plasma, by $NH_3$ plasma or by gas annealing with $NH_3$. A preferred temperature range for this dry cleaning processes is 20° C. to 450° C. and most preferably 300° C. to 400° C.

Figure 5:
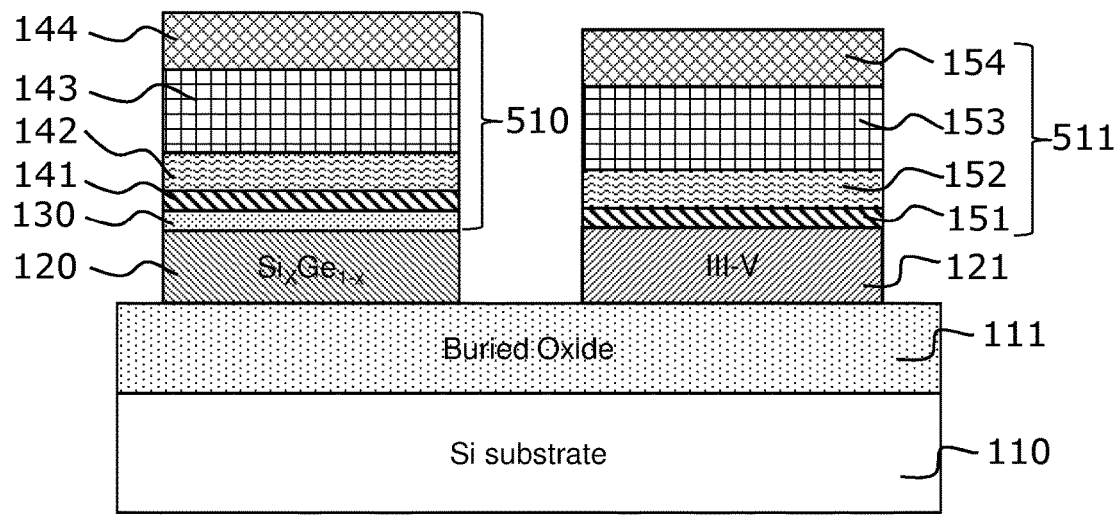

FIG. 5 shows a structure 500 that is a cross-sectional view of the structure of FIG. 4 after the formation of a first unpatterned gate stack structure 510 and a second unpatterned gate stack structure 511 on the first channel structure 120 and the second channel structure 121 respectively. More particularly, the first unpatterned gate stack structure 510 has been deposited on the first native oxide layer 130 and the second unpatterned gate stack structure 511 has been deposited directly on the second channel structure 121.

The first gate stack structure 510 comprises the first native oxide layer 130 as interface control layer. The first gate stack structure 510 comprises a further interface control layer 141 deposited on the first native oxide layer 130. In addition, the first gate stack structure 510 comprises a first high-k dielectric layer 142 deposited on the interface control layer 141, a first metal layer 143 deposited on the first high-k dielectric layer 142 and a first gate cap layer 144 deposited on the first metal layer 143. The first native oxide layer 130 serves as interface between the first channel structure 120 and the interface control layer 141 and minimizes or reduces defects at this interface. This in turn improves the performance of the final devices.

The second gate stack structure 511 comprises an interface control layer 151 deposited directly on the second channel structure 121, a second high-k dielectric layer 152 deposited on the second interface control layer 151, a second metal layer 153 deposited on the second high-k dielectric layer 152 and a second gate cap layer 154 deposited on the second metal layer 153. The interface control layer 151 of the second gate stack 511 serves as interface between the second channel structure 121 and the second high-k dielectric layer 152 and minimizes or reduces defects at this interface. This in turn improves the performance of the final devices. The interface between the second channel structure 121 and the second high-k dielectric layer 152 is free of any native oxides of the second semiconductor material.

The interface control layer 141 of the first gate stack 140 is not needed for the function of the first gate stack 140, but is just provided to ease co-fabrication.

The interface control layers 141, 151 may comprise e.g. $Al_2O_3$, AlON, HfON, ZrON, $TiO_2$, TiON, SiN or $SiO_2$.

The interface control layers 141 and 151 may be formed by methods well known in the art, in particular by atomic layer deposition (ALD). Generally any other suitable methods may be used as well such as chemical vapor deposition (CVD) methods.

The deposition of the high-k dielectric layers 142, 152, the deposition of the metal layers 143, 153 and the deposition of the gate cap layers 144, 154 may also be performed by methods well known in the art, in particular by atomic layer deposition (ALD) or generally any other suitable methods such as chemical vapor deposition (CVD) or Physical Vapor Deposition (PVD) methods.

The first high-k dielectric layer 142 and the second high-k dielectric layer 152 may be embodied, e.g., as layers comprising $HfO_2$, HfON, HfSiON, $ZrO_2$, ZrON, $HfO_2$, HfON, $ZrO_2$, ZrON, $LaO_3$, La—Al—O, La—Lu—O, SiN or SiON.

The first metal gate layer 143 and the second metal gate layer 153 may be embodied, e.g., as layers comprising Ti, Hf, TiN or Al. The first metal gate layer 143 may serve as scavenging layer to scavenge the first native oxide layer 130, thereby reducing the thickness of the first native oxide layer 130.

Embodiments of the invention allow fabricating the first gate stack structure 510 and the second gate stack structure 511 simultaneously at the same lithography level. In other words, the first gate stack structure 510 and the second gate stack structure 511 can be fabricated in parallel, thereby avoiding additional lithography and etching steps as would be typically required in a conventional process that would involve masking the second gate stack during the formation of the first gate stack and masking the first gate stack during the formation of the second gate stack. Such a saving of one or two lithography steps is a significant advantage given that a lithography step is the most expensive process in modern CMOS manufacturing.

Figure 6:
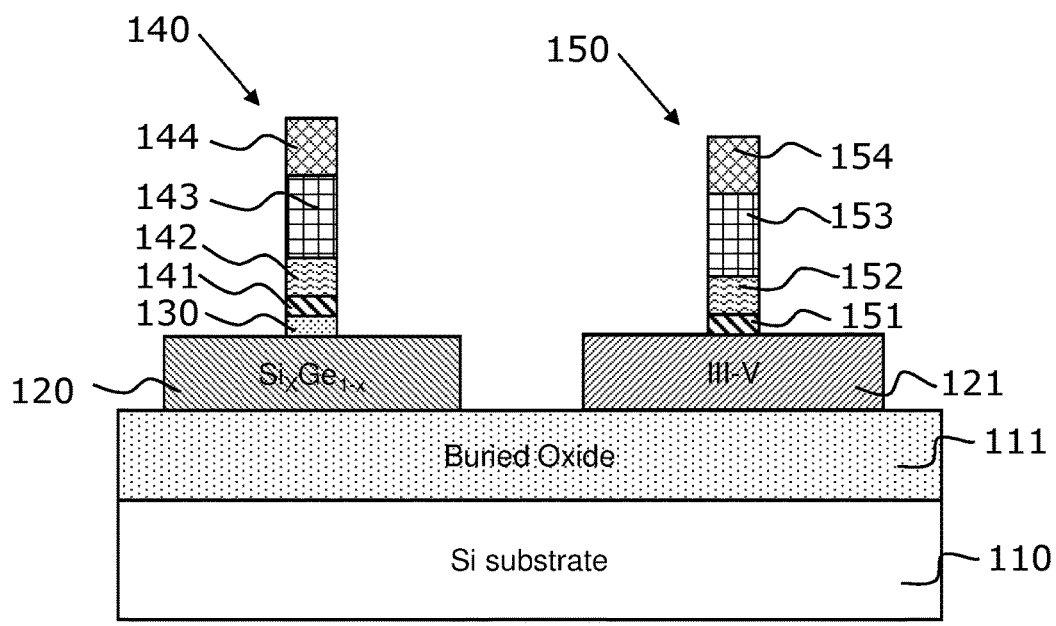

FIG. 6 shows a structure 600 that is cross-sectional view of the structure of FIG. 5 after the first gate stack structure 510 and the gate stack structure 511 have been patterned and etched. This has formed a first gate stack 140 and a second gate stack 150. The patterning and etching may be performed by standard lithography as is well known in the art.

Figure 7:
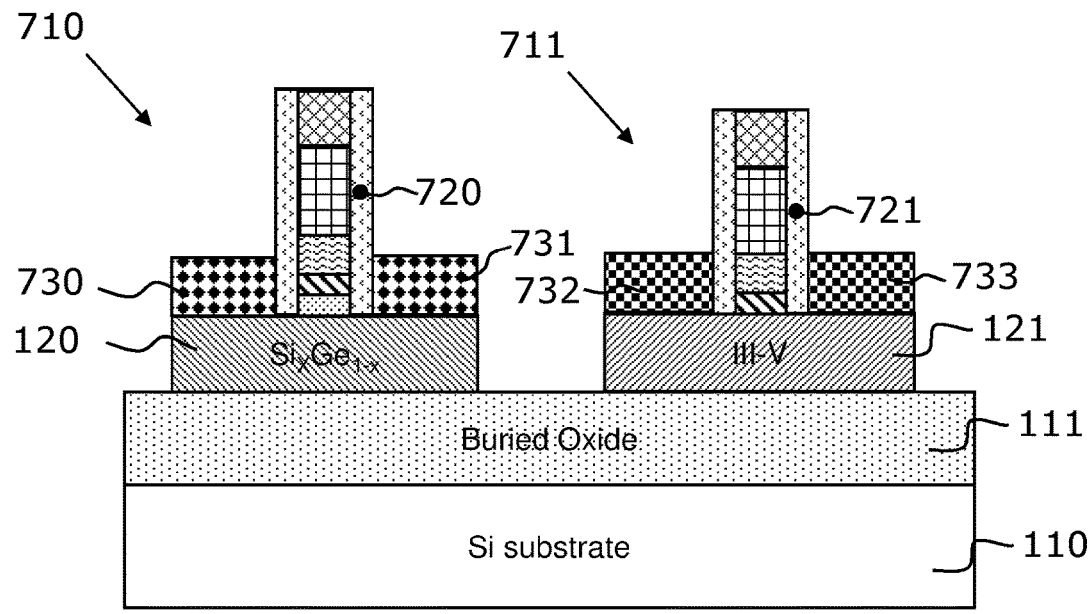

FIG. 7 shows a structure 700 that is a cross-sectional view of a final device. The final device comprises a p-FET 710 and an n-FET 711. The p-FET 710 comprises insulating spacers 720 formed on sidewalls of the first gate stack 140. The n-FET 711 comprises insulating spacers 721 formed on sidewalls of the second gate stack 150. The p-FET 710 comprises a raised source layer 730 and a raised drain layer 731 formed on the first channel structure 120. The n-FET 711 comprises a raised source layer 732 and a raised drain layer 733 formed on the second channel structure 121.

The formation of the insulating spacers 720, 721 as well as the formation of the raised source layers 730, 732 and the formation of the raised drain layers 731, 733 may be done by methods well known in the art using lithography steps to pattern and etch the spacers and selective epitaxy steps to deposit the raised source and drain layers on the first and the second channel structure respectively. In such devices with raised source and drains the source and drain layers are formed above the channel regions to achieve low series resistance. The insulating spacers may comprise, e.g., SiN or derivatives thereof.

The first raised source layer 730 and the first raised drain layer 731 comprises the first semiconductor material and may hence be embodied as $Si_xGe_{1-x}$, where x=0 to 1. According to preferred embodiments the ratio x of Si in the SiGe alloy of the first source layer 730 and the first drain layer 731 may be different from the ratio x of Si in the SiGe alloy of the first channel structure 120. According to a preferred embodiment, the ratio x is 0.5 in the first source layer 730 and the first drain layer 731 and 0.75 in the first channel structure 120. Such a different ratio may induce strain in the first channel structure 120 which results in a compressed channel structure 120 and an improved device performance. The first source layer 730 and the first drain layer 731 are doped with a p-type dopant, e.g. with boron (B). The doping can be preferably performed by in-situ doping during the selective epitaxy step.

The second raised source layer 732 and the second raised drain layer 733 comprises the second semiconductor material and may hence be generally embodied by a group III-V compound material. According to preferred embodiments the second raised source layer 732 and the second raised drain layer 733 may be layers comprising $In_xGa_{1-x}As$ where x=0 to 1 or layers comprising InP or layers comprising InGaSb. In case of layers comprising $In_xGa_{1-x}As$ the ratio x of In in the second source layer 732 and the second drain layer 733 may be different from the ratio x of In in the $In_xGa_{1-x}As$ composition of the second channel structure 121. According to a preferred embodiment, the ratio x is 0.7 in the second raised source layer 732 and the second raised drain layer 733 and 0.53 in the second channel structure 121. Such a different ratio may induce strain in the second channel structure 121 which results in a compressed channel structure 121 and an improved device performance. The second raised source layer 732 and the second raised drain layer 733 are doped with an n-type dopant, e.g. with Si, Sn, Se, Te or Ge. The doping can be preferably performed by in-situ doping during the selective epitaxy step.

As can be derived from the description above the final structure 700 with the dual gate stack comprising the two different semiconductor channel materials SiGe and III-V can be co-formed/co-fabricated on a single substrate/wafer 110 in an efficient and scalable way. In particular, embodiments of the invention allow co-fabrication of the different interface control layers needed between the SiGe channel material and the high-k material on the one hand and the III-V channel material and the high-k material on the other hand in an efficient way saving one or two lithography steps compared with conventional approaches.

FIGS. 8-15 show successive stages for fabricating a dual gate CMOS structure according to embodiments of the invention in which the gate stack is formed according to a "gate last" approach. In a "gate last" approach the gate stack is formed after the formation of the source layers and the drain layers. The "gate last" approach may be considered as an advantageous process for scaled CMOS nodes as the gate stacks are formed after the high temperature epitaxy processes forming the source and drain layers, which does not degrade the gate stack performance.

Figure 8:
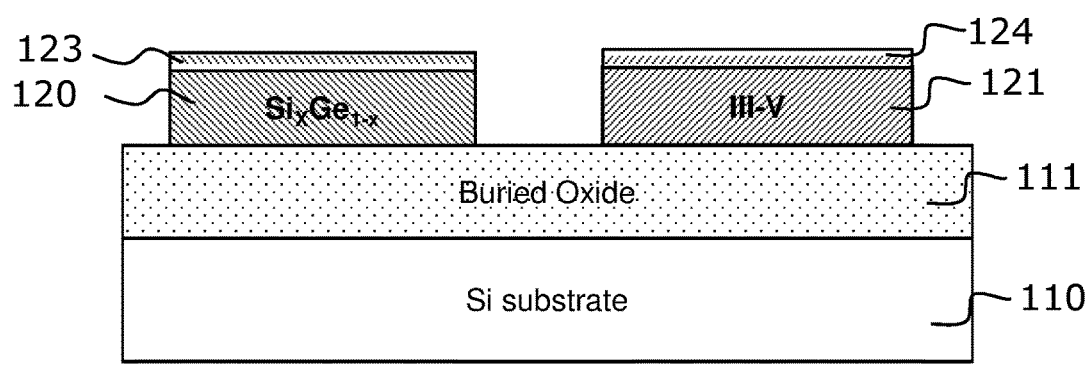

FIG. 8 illustrates a cross-sectional view of a starting structure 800. The starting structure 800 corresponds the starting structure 100 of FIG. 1.

Figure 9:
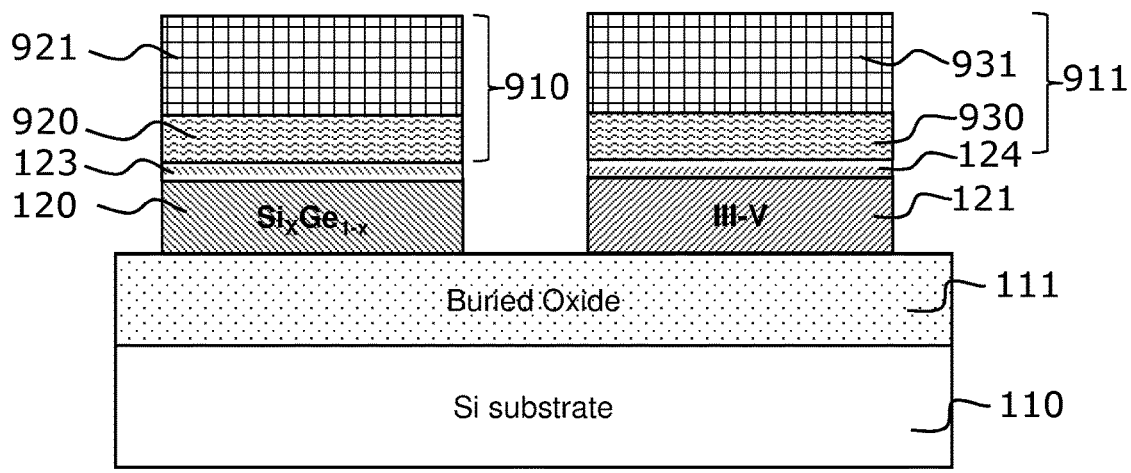

FIG. 9 shows a structure 900 that is a cross-sectional view of the structure of FIG. 8 after the formation of a first unpatterned dummy gate stack structure 910 and a second unpatterned dummy gate stack structure 911 on the first channel structure 120 and the second channel structure 121 respectively. More particularly, the first unpatterned dummy gate stack structure 910 has been deposited on the naturally grown oxide layer 123 and the second unpatterned dummy gate stack structure 911 has been deposited on the naturally grown oxide layer 124.

The first unpatterned dummy gate stack structure 910 comprises the naturally grown oxide layer 123, a first high-k dielectric layer 920 deposited on the naturally grown oxide layer 123 and a dummy gate material 921 deposited on the first high-k dielectric layer 920. The first dummy gate material could comprise poly-Si, amorphous Si or a metal.

The second unpatterned dummy gate stack structure 911 comprises the naturally grown oxide layer 124, a second high-k dielectric layer 930 deposited on the naturally grown oxide layer 124 and a dummy gate material 931 deposited on the second high-k dielectric layer 930. The dummy gate material could comprise poly-Si, amorphous Si or a metal.

Figure 10:
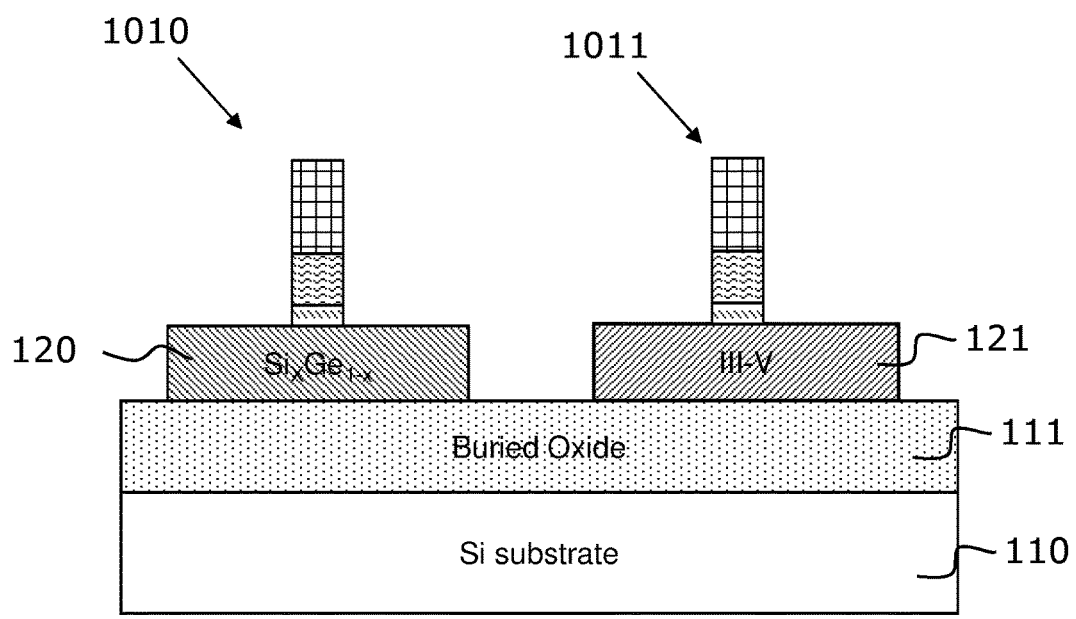

FIG. 10 shows a structure 1000 that is a cross-sectional view of the structure of FIG. 9 after the first dummy gate stack structure 910 and the second dummy gate stack structure 911 have been patterned and etched. This has formed a first dummy gate stack 1010 and a second dummy gate stack 1011. The patterning and etching may be performed by standard lithography as well known in the art, e.g., by photolithography and etching. This includes application of the photoresist, light exposure, developing, etching and photoresist removal. According to other embodiments electron beam lithography may be used. The first dummy gate stack 1010 and the second dummy gate stack 1011 serve just as placeholder for final gate stacks to be formed in later stages of the method.

Figure 11:
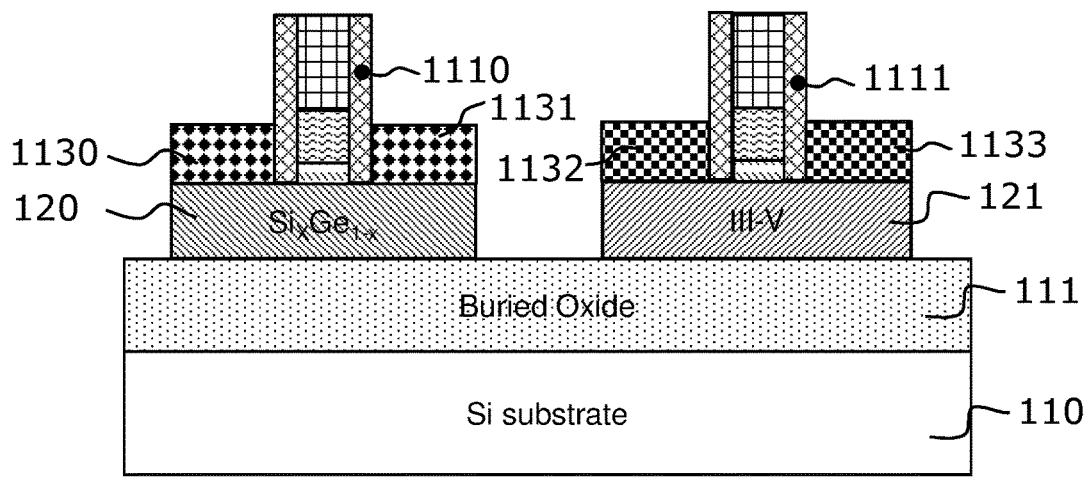

FIG. 11 shows a structure 1100 that a cross-sectional view after formation of raised source and drain layers. More particularly, the structure 1100 comprises insulating spacers 1110 formed on sidewalls of the first dummy gate stack 1010 and insulating spacers 1111 formed on sidewalls of the second dummy gate stack 1011. A raised source layer 1130 and a raised drain layer 1131 have been formed on the first channel structure 120. Furthermore, a raised source layer 1132 and a raised drain layer 1133 have been formed on the second channel structure 121. The formation of the insulating spacers 1110, 1111 as well as the formation of the raised source layers 1130, 1132 and the formation of the raised drain layers 1131, 1133 may be done by methods well known in the art using lithography steps to pattern and etch the spacers and selective epitaxy steps to deposit the raised source and drain layers on the first and the second channel structure respectively.

The first raised source layer 1130 and the first raised drain layer 1131 comprises the first semiconductor material and may hence be embodied as $Si_xGe_{1-x}$, where x=0 to 1. According to preferred embodiments the ratio x of Si in the SiGe alloy of the first source layer 1130 and the first drain layer 1131 may be different from the ratio x of Si in the SiGe alloy of the first channel structure 120 as described with reference to FIG. 7. The first source layer 1130 and the first drain layer 1131 are doped with a p-type dopant, e.g., with boron (B). The doping can be preferably performed by in-situ doping during the selective epitaxy step.

The second raised source layer 1132 and the second raised drain layer 1133 comprises the second semiconductor material and may hence be generally embodied by a group III-V compound material. According to preferred embodiments the second raised source layer 1132 and the second raised drain layer 1133 may be layers comprising $In_xGa_{1-x}As$ where x=0 to 1 or layers comprising InP or layers comprising InGaSb. In case of layers comprising $In_xGa_{1-x}As$ the ratio x of In in the second source layer 1132 and the second drain layer 1133 may be different from the ratio x of In in the $In_xGa_{1-x}As$ composition of the second channel structure 121 as described with reference to FIG. 7. The second raised source layer 1132 and the second raised drain layer 1133 are doped with an n-type dopant, e.g., with Si, Sn, Se, Te or Ge. The doping can be preferably performed by in-situ doping during the selective epitaxy step.

Figure 12:
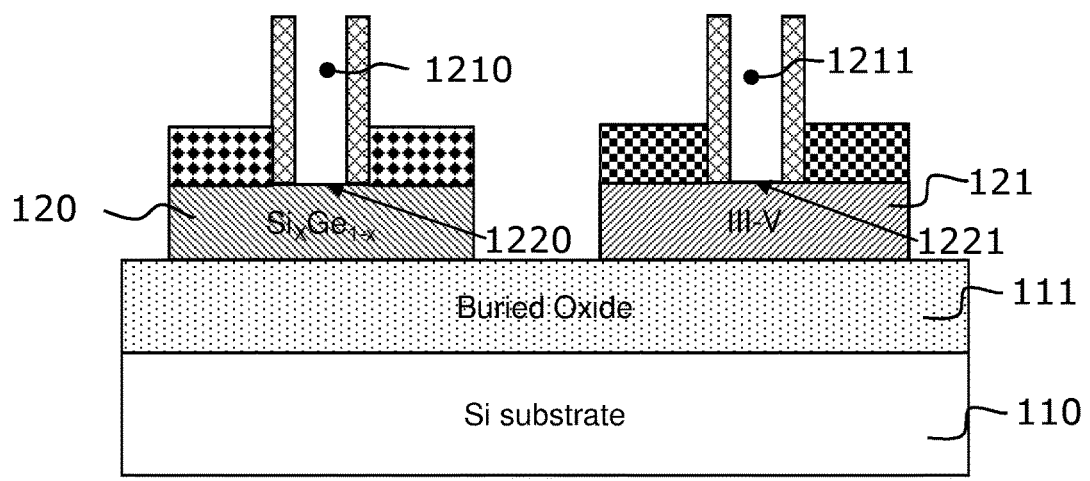

FIG. 12 shows as structure 1200 a cross-sectional view after removal of the first dummy gate stack 1010 and the second dummy gate stack 1011. The removal may be performed by standard lithography and etching as well known in the art, e.g., photolithography or electron-beam lithography and etching. The removal has provided a first cavity structure 1210 comprising at its bottom 1220 the surface of the first channel structure 120 and a second cavity structure 1211 comprising at its bottom 1221 the surface of the second channel structure 121.

Figure 13:
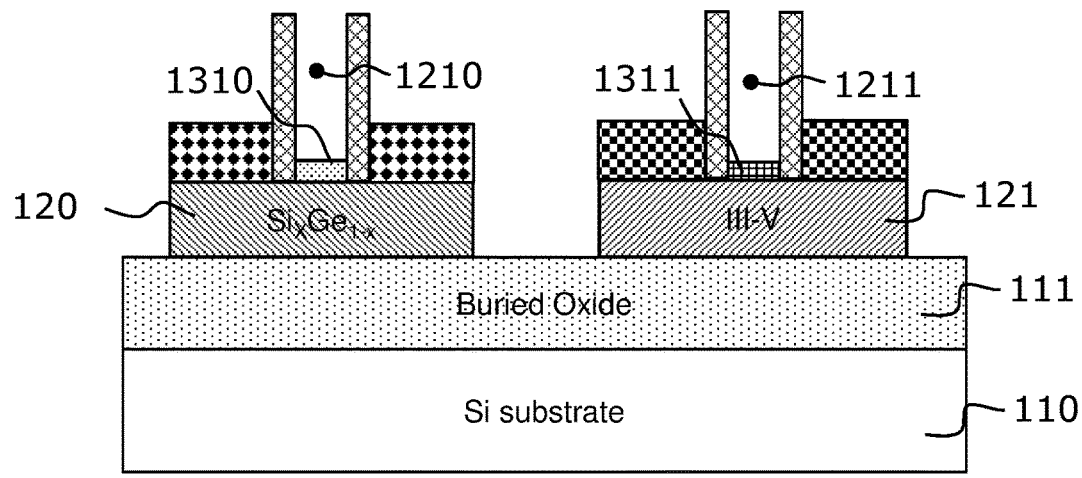

FIG. 13 shows as structure 1300 a cross-sectional view after a first native oxide layer 1310 has been grown in the first cavity 1210 on the surfaces of the first channel structure 120 and a second native oxide layer 1311 has been grown in the second cavity 1211 on the second channel structure 121. The first native oxide layer 1310 and the second native oxide layer 1311 may be grown in particular by performing a controlled oxidation of the surfaces of the first channel structure 120 and the second channel structure 121. Such a controlled oxidation may be in particular a chemical oxidation. Such a controlled oxidation allows controlling the thickness and quality of the first native oxide layer 1310 and the second native oxide layer 1311. The first native oxide layer 1310 comprises native oxides of the first semiconductor material, i.e. native oxides of Si and/or Ge, namely $SiO_2$ and/or $GeO_2$. The second native oxide layer 1311 comprises native oxides of the second semiconductor material, i.e. native oxides of group III-V materials. According to embodiments the first native oxide layer 1310 and the second native oxide layer 1311 are formed by a controlled self-limiting oxidation. Such a controlled self-limiting oxidation may form thin native oxide layers. According to preferred embodiments the first native oxide layer 1310 has a thickness of less than 2 nm. According to further preferred embodiments it can have a thickness as small as a monolayer of oxide molecules which may correspond to a thickness of app. 0.3 nm.

The oxidation of the exposed surfaces of the first channel structure 120 and the second channel structure 121 may be performed by the same methods as described with reference to FIG. 3. The first native oxide layer 1310 is desired and has the function of an interlayer for a subsequent formation of a gate stack structure on the first channel structure 120. The second native oxide layer 1311 is undesired for a subsequent formation of a gate stack on the second channel structure 121.

Figure 14:
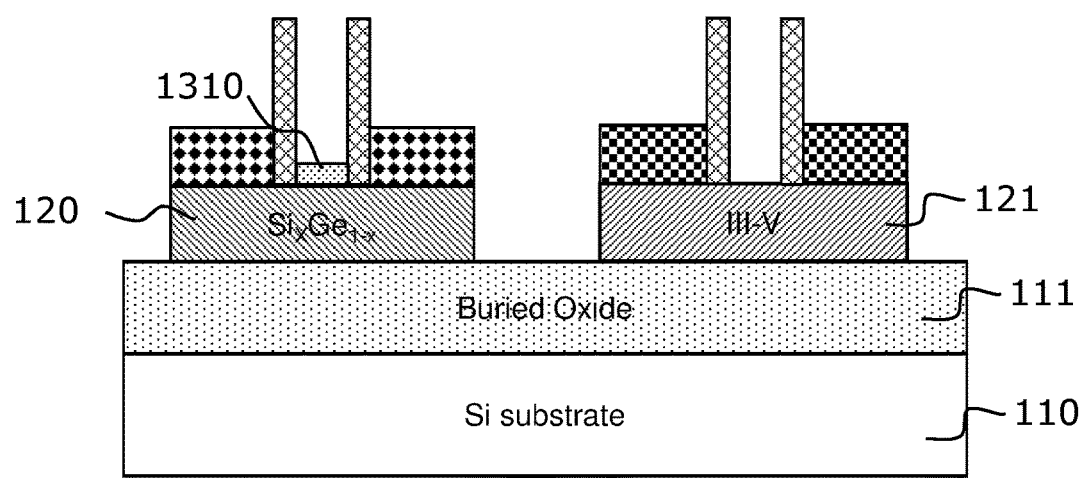

FIG. 14 show as structure 1400 a cross-sectional view of the structure of FIG. 13 after the surfaces of the first native oxide layer 1310 and the second native oxide layer 1311 have been treated with a selective cleaning process. The selective cleaning process has selectively removed the second native oxide layer 1311 only, while the first native oxide layer 1310 has not been affected by the selective cleaning process and has remained unchanged or substantially unchanged. According to embodiments of the invention the selective cleaning process takes advantage of the different chemical behavior of the oxidized SiGe materials and the oxidized III-V materials. This allows to selectively remove the second native oxide layer 1311 only.

The selective cleaning process may be performed by the same methods as described with reference to FIG. 4, namely wet cleaning with, e.g., HCl, $H_3PO_4$ or $H_2SO_4$ or dry cleaning by, e.g., $H_2$ plasma, $NH_3$ plasma or gas annealing with $NH_3$.

Figure 15:
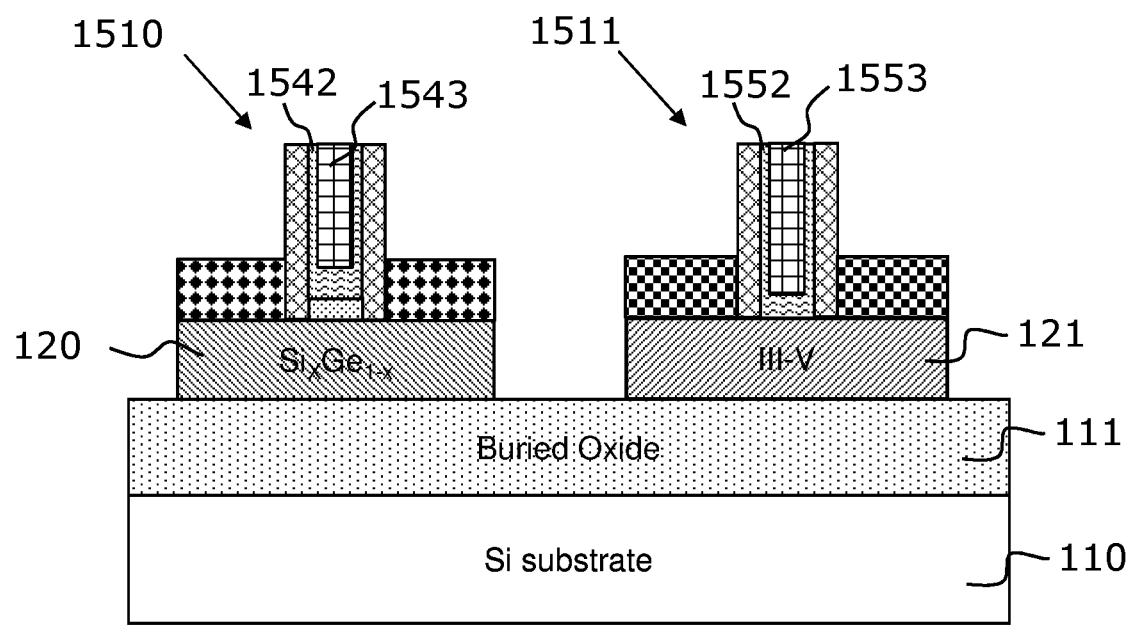

FIG. 15 shows as structure 1500 a cross-sectional view of a final device structure after the formation of a first gate stack 1510 in the first cavity structure 1210 and the formation of a second gate stack 1511 in the second cavity structure 1211. More particularly, the first gate stack structure 1510 has been deposited on the first native oxide layer 1310 and the second gate stack structure 1511 has been deposited directly on the second channel structure 121.

The first gate stack structure 1510 comprises the first native oxide layer 1310 as interface control layer. The first gate stack structure 1510 comprises furthermore a first high-k dielectric layer 1542 deposited on the first native oxide layer 1310 and a first metal layer 1543 deposited on the first high-k dielectric layer 1542. The first native oxide layer 1310 serves as interface between the first channel structure 120 and the first high-k dielectric layer 1542 and minimizes or reduces defects at this interface. This in turn improves the performance of the final devices.

The second gate stack structure 1511 comprises in this embodiment no interface control layer and accordingly a second high-k dielectric layer 1552 has been deposited directly on the second channel structure 121. Nevertheless the interface between the second channel structure 121 and the second high-k dielectric layer 1552 is free of any native oxides of the second semiconductor material.

Furthermore, a second metal layer 1553 has been deposited on the second high-k dielectric layer 1552. Optionally an additional interface control layer as interface between the second channel structure 121 and the second high-k dielectric layer 1552 may be provided according to other embodiments of the invention and as described with reference to FIGS. 1 to 7.

The deposition of the first high-k dielectric layer 1542, the second high-k dielectric layer 1552, the first metal layer 1543 and the second metal layer 1553 may be performed by methods well known in the art, in particular by atomic layer deposition (ALD) or generally any other suitable methods may such as chemical vapor deposition (CVD) methods. Due to the formation within the cavity structures 1210, 1211 the deposition of the first high-k dielectric layer 1542, the second high-k dielectric layer 1552, the first metal layer 1543 and the second metal layer 1553 is performed as conformal deposition.

The first high-k dielectric layer 1542 and the second high-k dielectric layer 1552 may be embodied as layers comprising $HfO_2$, HfON, HfSiON, $ZrO_2$, ZrON, $HfO_2$, HfON, $ZrO_2$, ZrON, $LaO_3$, La—Al—O, La—Lu—O, SiN or SiON. The first metal gate layer 1543 and the second metal gate layer 1553 may be embodied, e.g., as layers comprising Ti, Hf, TiN or Al. The first metal gate layer 1543 may serve as scavenging layer to scavenge the first native oxide layer 1310, thereby reducing the thickness of the first native oxide layer 1310.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a dual gate stack of a CMOS structure, the method comprising:
   providing a semiconductor substrate;
   forming a first channel structure comprising a first semiconductor material and a second channel structure comprising a second semiconductor material on the substrate; wherein the first semiconductor material is comprised of $Si_xGe_{1-x}$ where x=0 to 1 and wherein the second semiconductor material is comprised of a group III-V compound material;
   oxidizing a surface of the first channel structure and a surface of the second channel structure, thereby forming a first native oxide layer comprising an oxide of the first semiconductor material and a second native oxide layer comprising an oxide of the second semiconductor material;
   treating the first native oxide layer and the second native oxide layer by a selective cleaning process that selectively removes the second native oxide layer only;
   forming a first gate stack comprising the first native oxide layer as interface control layer, a first high-k dielectric layer and a first metal layer on the first channel structure;
   forming a second gate stack comprising a second high-k dielectric layer and a second metal gate layer on the second channel structure.

2. A method as claimed in claim 1, wherein the second semiconductor material is comprised of one of: $In_xGa_{1-x}As$ where x=0 to 1; InP; InGaSb and further alloyed combinations of (In, Ga) (As, Sb, P).

3. A method as claimed in claim 1, wherein the first and the second native oxide layer are formed by a controlled oxidation.

4. A method a claimed in claim 1, wherein the first native oxide layer has a thickness of less than 2 nm.

5. A method as claimed in claim 1, wherein oxidizing the surfaces of the first channel structure and the second channel structure comprises one of:
   treatment of the surfaces with hydrogen peroxide ($H_2O_2$);
   treatment of the surfaces with ozonated deionized water ($DIO_3$);
   treatment of the surfaces with $O_2$ plasma;
   treatment of the surfaces with ozone;
   thermal oxidation with a temperature below 500° C.; and
   high pressure oxidation.

6. A method as claimed in claim 1, wherein the selective cleaning process comprises wet cleaning with one of: HCl; $H_3PO_4$ and $H_2SO_4$.

7. A method as claimed in claim 1, wherein the selective cleaning process comprises dry cleaning by treatment of the first and the second native oxide layer by one of:
   $H_2$ plasma;
   $NH_3$ plasma; and
   $NH_3$ gas annealing.

8. A method as claimed in claim 1, further comprising forming an interface control layer between the second high-k dielectric layer and the surface of the second channel structure and a corresponding interface control layer between the first native oxide layer and the first high-k dielectric layer.

9. A method as claimed in claim 1, further comprising cleaning the surfaces of the first channel structure and the second channel structure before oxidizing their surfaces.

10. A method as claimed in claim 1, further comprising forming a gate cap layer of an insulating material on the first and the second metal gate layer.

11. A method as claimed in claim 1, wherein the first high-k dielectric layer and the second high-k dielectric layer comprise one of: $HfO_2$, HfON, HfSiON, $ZrO_2$, ZrON, $LaO_3$, La—Al—O, La—Lu—O, SiN and SiON.

12. A method as claimed in claim 1, wherein the first metal gate layer and the second metal gate layer comprise one of: Ti, Hf, TiN, Al, doped-polysilicon and silicide.

13. A method as claimed in claim 1, wherein the interface control layer between the second high-k dielectric layer and the surface of the second channel structure and the interface control layer between the first native oxide layer and the first high-k dielectric layer comprise one of: $Al_2O_3$, AlON, HfON, ZrON, $TiO_2$, TiON, SiN and $SiO_2$.

14. A method as claimed in claim 1, comprising a further step of scavenging the first native oxide layer by the first metal gate layer.

15. A method as claimed in claim 1, further comprising, before the step of oxidizing the surfaces of the first and the second channel structure, the steps of:
   forming a first dummy gate stack on the first channel structure and a second dummy gate stack on the second channel structure;
   forming insulating spacers around the dummy gate stack,
   forming a first raised source layer and a first raised drain layer on the first channel structure by selective epitaxy;
   forming a second raised source layer and a second raised drain layer on the second channel structure by selective epitaxy;
   removing the first dummy gate stack and the second dummy gate stack, thereby providing a first cavity structure comprising at its bottom the surface of the first channel structure and a second cavity structure comprising at its bottom the surface of the second channel structure.

16. A method as claimed in claim 1, further comprising:
   forming an insulating layer on the first gate stack, the first channel structure, the second gate stack and the second channel structure;
   selectively removing by a first lithography step the insulating layer from the first channel structure to form a first insulating spacer on sidewalls of the first gate stack;

forming a first raised source layer and a first raised drain layer on the first channel structure by selective epitaxy;

selectively removing by a second lithography step the insulating layer from the second channel structure to form a second insulating spacer on sidewalls of the second gate stack;

forming a second raised source layer and a second raised drain layer on the second channel structure by selective epitaxy.

* * * * *